United States Patent [19]

Nishikawa et al.

[11] Patent Number: 4,482,915

[45] Date of Patent: Nov. 13, 1984

[54] LEAD FRAME FOR PLASTIC ENCAPSULATED SEMICONDUCTOR DEVICE

[75] Inventors: Mikio Nishikawa, Kyoto; Hiroyuki Fujii, Osaka; Kenichi Tateno, Shiga; Masami Yokozawa, Kyoto, all of Japan

[73] Assignee: Matsushita Electronics Corp., Osaka, Japan

[21] Appl. No.: 395,799

[22] Filed: Jul. 6, 1982

[30] Foreign Application Priority Data

Jul. 6, 1981 [JP] Japan .................. 56-100697[U]
Jul. 9, 1981 [JP] Japan ...................... 56-107905

[51] Int. Cl.³ .................. H01L 23/30; H01L 23/32; H01L 21/60
[52] U.S. Cl. ........................ 357/72; 357/70; 357/68
[58] Field of Search ............ 357/81, 79, 68, 70, 357/74, 72; 174/52 FD, 16 HS; 264/272.17; 29/588; 427/82, 87

[56] References Cited

U.S. PATENT DOCUMENTS

| | | | |
|---|---|---|---|
| 3,381,071 | 4/1968 | Logan et al. | 357/80 X |
| 3,431,092 | 3/1969 | Lehner | 357/81 X |
| 3,902,148 | 8/1975 | Drees et al. | 357/70 |
| 3,909,838 | 9/1975 | Beyerlein | 357/70 |
| 3,930,114 | 12/1975 | Hodge | 264/272.17 |
| 3,950,140 | 4/1976 | Bliven et al. | 357/70 |
| 4,250,347 | 2/1981 | Fierkens | 264/272.17 |

FOREIGN PATENT DOCUMENTS

| | | | |
|---|---|---|---|
| 0026672 | 2/1980 | Japan | 357/70 |
| 0076542 | 6/1981 | Japan | 29/588 |

Primary Examiner—Andrew J. James
Assistant Examiner—S. V. Clark
Attorney, Agent, or Firm—Burgess, Ryan & Wayne

[57] ABSTRACT

The invention provides a lead frame for a plastic encapsulated semiconductor device wherein one of the external leads connected to a first connecting band extends from one edge of a substrate support which supports a semiconductor substrate and also serves as a heat sink, two strips are connected to a second connecting band from the other edge of the substrate support, a notch is formed between the two strips of the second connecting band to allow proper positioning of the lead frame and to decrease thermal deformation during plastic encapsulation. Further, another lead frame is provided wherein a through hole is formed extending within the substrate support in the direction of thickness thereof in order to allow uniform flow of the resin and to form a thin resin layer on the rear surface of the substrate support.

5 Claims, 7 Drawing Figures

LEAD FRAME FOR PLASTIC ENCAPSULATED SEMICONDUCTOR DEVICE

BACKGROUND OF THE INVENTION

The present invention relates to a lead frame for a plastic encapsulated semiconductor device which can be used with relatively high power.

Plastic encapsulation of semiconductor devices has been recently developed. Manufacture of relatively high-power transistors includes plastic encapsulation. In these devices, substrate supports of a lead frame to which semiconductor substrates or elements are mounted also serve as heat sinks. Rear surfaces of the substrate supports carry no semiconductor elements and are not covered with plastic but are open to the atmosphere. With the above structure, when mounting the plastic encapsulated power semiconductor devices on various types of electrical apparatus, the exposed sides of the substrate supports are thermally coupled to radiators. In this case, insulating plates or films must be interposed between the substrate supports and the radiators, which must be electrically insulated from each other. For this reason, the mounting and assembly operations become cumbersome and time-consuming.

In order to eliminate the above drawbacks, the rear surface of each substrate support is covered with a thin resin layer to provide insulation of the substrate supports from the external radiators. In the lead frame used for this purpose, one external lead connected to a first connecting band extends from one edge of each substrate support, and two strips connected to a second connecting band extend from the other edge of each substrate support. For plastic encapsulating inside molds, the external lead and the two strips of each substrate support are firmly clamped between the upper and lower molds. Thus, the insulating thin resin layer is uniformly formed on the rear surface of each substrate support.

However, in this case, the lead frame may be thermally deformed by the heat of the plastic encapsulation process. Further, since a space between the rear surface of each substrate support and the lower mold is very narrow, the plastic does not flow well, resulting in defective molding.

SUMMARY OF THE INVENTION

It is, therefore, a first object of the present invention to provide a lead frame which effectively eliminates thermal deformation and resultant distortion (residual stress) arising from plastic encapsulation.

It is a second object of the present invention to provide a lead frame which allows uniform formation of a thin resin layer on the rear surface of a substrate support by improving flow of a plastic in a mold.

In order to achieve the first object of the present invention, there is provided a lead frame, a second connecting band of which has notches in order to absorb thermal deformation and resultant distortion. Further, in order to achieve the second object of the present invention, there is provided a lead frame, each substrate support of which has through holes through which the plastic is easily flown onto the lower surface of the substrate support.

As a result, a plastic encapsulated semiconductor device which has an electrically insulating structure and which has a uniform thin plastic layer on the rear surface of each substrate support can be manufactured with high yield.

Other objects, features and advantages of the present invention will be apparent from the following detailed description taken in conjunction with the accompanying drawings.

DETAILED DESCRIPTION OF THE PRIOR ART

Figure 1:
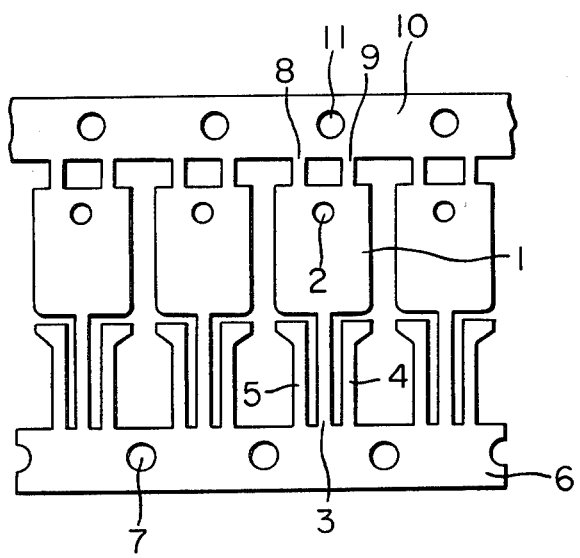
FIG. 1 is a plan view of a conventional lead frame for plastic encapsulated semiconductor devices.
Figure 2:
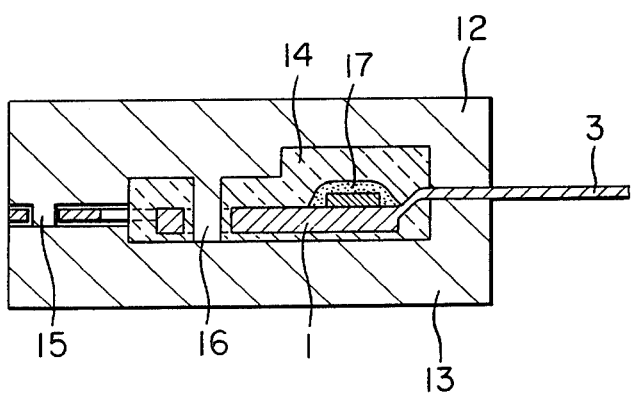
FIG. 2 is a cross-sectional view of a plastic encapsulated transistor using the conventional lead frame in FIG. 1.

FIG. 1 is a plan view of a lead frame used for plastic encapsulated semiconductor devices having an electrically insulating structure by means of a thin resin layer covered on the rear surface of a substrate support, a front surface of which has a semiconductor element thereon. The lead frame is disclosed in Japanese Patent Application No. 32,229/1981 (U.S. patent application Ser. No. 352,119/1982, Canadian Patent Application No. 397,622/1982, and EPC Patent Application No. 82.101605.2) filed by the same applicant. Referring to FIG. 1, reference numeral 1 denotes a substrate support to which a semiconductor element (e.g., power transistor element) is mounted; 2 denotes through holes for mounting the semiconductor device on radiators with set screws; 3, 4 and 5 denote external leads; 6 denotes a first connecting band having holes 7 for determining a feeding pitch and allowing positioning of the lead frame during plastic encapsulation. Two strips 8 and 9 extend from one side of the substrate support 1 and the external strip 3 extends from the other side thereof. The stripes 8 and 9 are connected to a second connecting band 10. Holes 11 for allowing positioning of the lead frame during plastic encapsulation are formed in the second connecting band 10 and fit with parts of the mold. FIG. 2 is a cross-sectional view of the plastic encapsulated semiconductor device using the lead frame described above. A resin 14 is injected into a cavity between upper and lower molds 12 and 13.

The external leads 3 to 5 of the lead frame are clamped along one side of the lead frame between the upper and lower molds 12 and 13, while the two strips 8 and 9 and the second connecting band 10 are clamped therebetween along the other side of the lead frame. A projection (not shown) of the upper mold 12 is fitted into each hole 7 formed in the first connecting band 6. Further, a projection 15 of the upper mold 12 is fitted into each hole 11 of the second connecting band 10. Reference numeral 16 denotes a projection for partially eliminating the resin to form a hole for the set screw; 17 denotes a power transistor element.

For plastic encapsulation of the power transistor using the lead frame described above, the substrate support 1 is supported by the external lead 3 and the strips 8 and 9 which are clamped between the upper and lower molds 12 and 13, and it floats in the cavity between the upper and lower molds 12 and 13. A thin resin layer is formed on the rear surface of the substrate support, which substrate support also serves as the heat sink and supports the power transistor on its one major surface. Thus, a plastic encapsulated semiconductor device is manufactured.

However, in performing plastic encapsulation with such a lead frame, defective molding often occurs.

The main causes of defective molding are thermal deformation of the lead frame during plastic encapsulation and incomplete injection of the resin. In the former case, changes in shape and thickness of the first and second connecting bands 6 and 10 and of the substrate support 1 result in thermal deformation due to heat applied in plastic encapsulation. The projections of the upper mold 12 are then not well-fitted into the holes 7 and 11 respectively formed in the first and second connecting bands 6 and 10. Further, when the lead frame is clamped between the upper and lower molds 12 and 13, part of the lead frame is deformed, resulting in defective molding. The above problems must be solved. In particular, since the second connecting band 10 is firmly mechanically connected to the substrate support 1, thermal deformation occuring in the second connecting band 10 tends to adversely affect the substrate support 1.

In the latter case, since the resin 14 has a lower thermal conductivity than the metal substrate support 1, the thickness of the resin layer formed on the rear surface of the substrate suport 1 must be as thin as possible. If for this purpose, a very thin resin layer is formed on the rear surface of the substrate support 1, a pinhole may be formed in the thin layer or a non-uniform layer may be formed thereon when the lead frame has only hole 2 in the substrate support 1, resulting in defective molding.

The defective molding described above is mainly caused by the smallness of the space between the rear surface of the substrate support 1 and the lower mold 13. The resin may not be able to flow into the gap, and gaseous bodies may be trapped in the resin.

DESCRIPTION OF THE PREFERRED EMBODIMENTS

Figure 3:
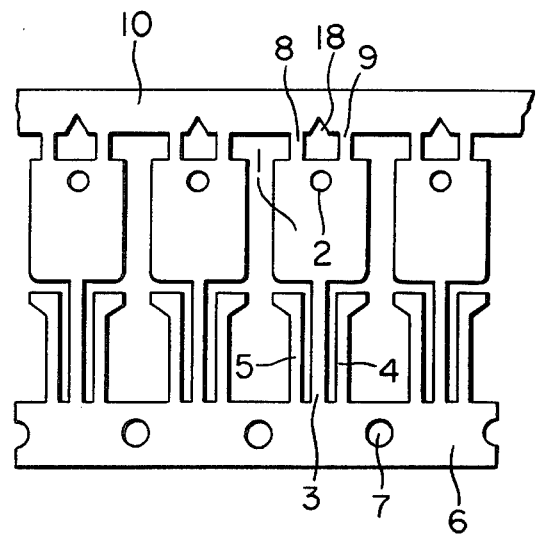
FIG. 3 is a plan view of a lead frame for plastic encapsulated semiconductor devices according to one embodiment of the present invention.

FIG. 3 is a plan view of a lead frame according to one embodiment of the present invention. The lead frame in FIG. 3 is the same as that in FIG. 1 except that a wedge-shaped notch 18 is formed between the strips 8 and 9 and at that side of the second connecting band 10 which opposes the substrate support 1. In the lead frame with the notch 18, the width of the second connecting band 10 is locally narrowed at the notch. Therefore, deformation of this part due to heat applied to the molds and, hence of the substrate support, is lessened.

The notch 18 acts as a positioning portion into which the projection of the upper mold 12 is fitted during plastic encapsulation. Since the notch 18 is wedge-shaped, the projection of the mold is properly fitted into the notch even if the relative position between the projection and the notch is slightly misaligned. The notch 18 effects proper positioning of the projection of the mold and excellent plastic encapsulation is performed. As a result, defective encapsulation due to misalignment is greatly decreased.

Figure 4:
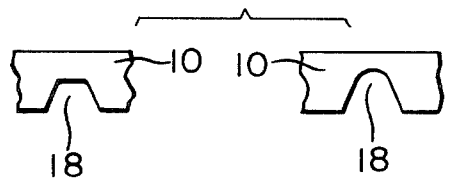
FIG. 4 is a view showing two different shapes of notches.

The notch 18 is formed having an angle of about 90°, which achieves a good feeding pitch for die bonding or wire bonding prior to plastic encapsulation. In the above embodiment, the notch 18 is wedge-shaped. However, as shown in FIG. 4, the shape of the notch may be of a trapezoidal or substantially semi-elliptical shape. Further, the position of the notch may be arbitrarily selected. Notches may be formed at the second connecting band between adjacent substrate supports; alternatively, notches may be formed in the first connecting band.

Figure 5:
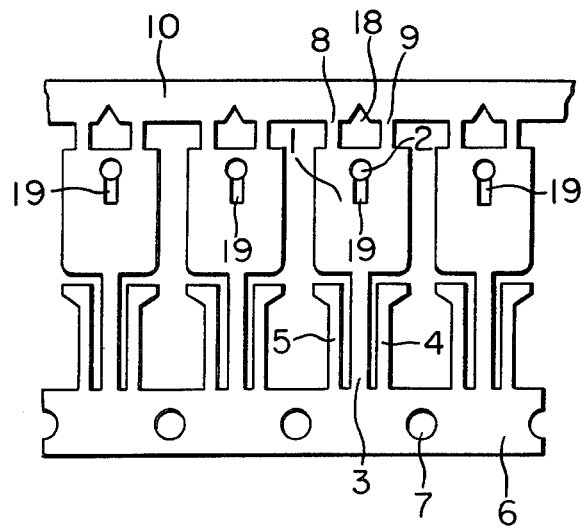
FIG. 5 is a plan view of a lead frame according to another embodiment of the present invention.

FIG. 5 is a plan view of a lead frame according to another embodiment of the present invention. The lead frame in FIG. 5 has the hole 2 formed in the substrate support. The lead frame in FIG. 5 is the same as that in FIG. 3 except that a through hole 19 is formed in the substrate support 1 to couple with the hole 2. The through hole 19 in FIG. 5 is of a rectangular shape; however, it is not limited to a rectangular shape. Note that the hole 19 must extend within the substrate support in the direction of thickness thereof.

Figure 6:
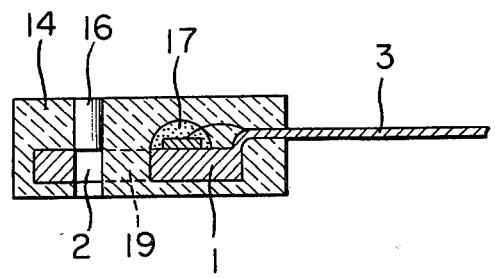
FIG. 6 is a cross-sectional view of a plastic encapsulated semiconductor device using the lead frame in FIG. 5.

FIG. 6 is a cross-sectional view of a plastic encapsulated semiconductor device using the lead frame shown in FIG. 5. The inside of the through hole 19 is filled with the resin 14, and the outer appearance of the semiconductor device thereof is the same as that in FIG. 2.

The through hole 19 effectively serves to obtain the plastic encapsulation structure in FIG. 6.

Figure 7:
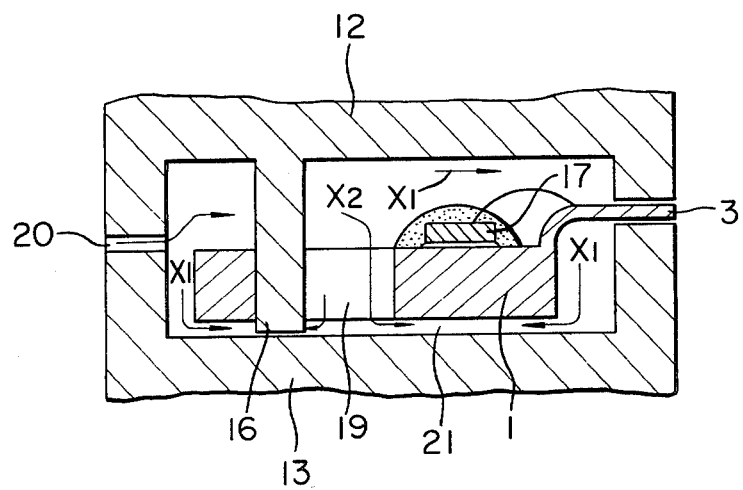
FIG. 7 shows a model for explaining resin flow within a mold when the lead frame in FIG. 5 is used.

FIG. 7 shows an illustration of resin flow within the cavity of the molds during plastic encapsulation. The resin is injected into the cavity through a gate 20 formed between the upper and lower molds 12 and 13. The resin flows into a space 21 between the substrate support 1 and the lower mold 13 in the conventional flow direction indicated by arrow $X_1$ and through the through hole 19 in the direction indicated by arrow $X_2$. The flow distance of the resin to fill the space 21 is shortened. The resin is quickly and uniformly injected into the space 21. Further, any gaseous bodies are effectively expelled from the space 21 to the outside. Since the resin finally fills the through hole 19, the thick resin layer on the front surface of the substrate support 1 and the thin resin layer on the rear surface thereof are integrally connected. Therefore, the thin resin layer in the prepared plastic encapsulated semiconductor device may not easily peel off from the rear surface of the substrate support 1.

The resin first fills that portion which does not have strong resistance to the resin flow. If the conventional lead frame is used, the resin finally fills the portion substantially at the center of the space immediately under the substrate support 1. Defective encapsulation occurs especially in this space. However, if the lead frame according to another embodiment of the present invention is used, the through hole 19 couples with the space 21 to eliminate any gaseous bodies. Therefore, the through hole 19 is preferably formed at the center of the substrate support 1.

As may be apparent from the above description, a highly reliable plastic encapsulated semiconductor device which has a thin film on the rear surface of the substrate supports serving as the heat sink is obtained if the lead frame according to the present invention is used. In the second embodiment, part of the through hole 19 couples with the hole 2 for the set screw, as exemplified. However, the through hole 19 may be formed independently of the hole 2. Further, the number of through holes 19 is not limited to one.

In summary, according to the present invention, defective encapsulation due to thermal deformation of the lead frame and incomplete resin flow are both greatly decreased in manufacturing a plastic encapsulated semiconductor device which has a uniform thin resin layer formed on the rear surface of the substrate support.

What is claimed is:

1. A lead frame for plastic encapsulated semiconductor device, comprising: a first connecting band; a plurality of external leads extending from said first connecting band in one direction; a substrate support connected to a distal end of one of said external leads and also serving as a heat sink; at least two strips one end of each of which is connected to a side of said substrate support, an opposite side of said substrate support being connected to said one of said plurality of external leads; and a second connecting band connected to the other ends of said at least two strips and opposing said first connecting band through said substrate support, wherein said second connecting band has, at a side thereof adjacent said substrate support and between said at least two strips, a notch for allowing positioning and for decreasing thermal deformation during encapsulation of said device.

2. A lead frame according to claim 1, wherein said notch has one of wedge, trapezoidal and semi-elliptical shapes.

3. A lead frame according to claim 1, wherein said notch is of a wedge shape and an included angle thereof is substantially 90°.

4. A lead frame for a plastic encapsulated semiconductor device, wherein a first hole for a set screw is formed to extend through said substrate support in the direction of thickness thereof, said substrate support being connected to one of a plurality of external leads extending from a first connecting band in one direction, and a second hole for allowing smooth flow of a resin during encapsulation of said device is formed to extend through said substrate support in the direction of the thickness thereof, a part of said second hole communicating with said first hole.

5. A lead frame according to claim 4, wherein at least part of said second hole is positioned substantially at a center of said substrate support.

* * * * *